(12) United States Patent
Gutschenritter et al.

(10) Patent No.: US 9,532,474 B2
(45) Date of Patent: Dec. 27, 2016

(54) DEVICE MOUNTING SYSTEM WITH LOCKING LEVER

(71) Applicant: Garmin Switzerland GmbH, Schaffhausen (CH)

(72) Inventors: Kathryn M. Gutschenritter, Overland Park, KS (US); David F. Lammers-Meis, Olathe, KS (US); Robert M. Kalis, Overland Park, KS (US)

(73) Assignee: Garmin Switzerland GmbH (CH)

( * ) Notice: Subject to any disclaimer, the term of this patent is extended or adjusted under 35 U.S.C. 154(b) by 14 days.

(21) Appl. No.: 14/602,006

(22) Filed: Jan. 21, 2015

(65) Prior Publication Data

US 2016/0212869 A1 Jul. 21, 2016

(51) Int. Cl.
*A42B 1/24* (2006.01)
*H05K 5/02* (2006.01)
*A42B 3/04* (2006.01)
*F16B 21/02* (2006.01)
*F16M 13/02* (2006.01)

(52) U.S. Cl.
CPC ........... *H05K 5/0221* (2013.01); *A42B 3/0406* (2013.01); *F16B 21/02* (2013.01); *F16M 13/02* (2013.01); *H05K 5/0204* (2013.01)

(58) Field of Classification Search
CPC .. H05K 5/0221; H05K 5/0204; A42B 3/0406; F16B 21/02; F16M 13/02
USPC ...................................... 248/205.3; 2/22, 6.6
See application file for complete search history.

(56) References Cited

U.S. PATENT DOCUMENTS

| 4,929,973 | A | * | 5/1990 | Nakatani | F16M 11/04 248/177.1 |
|---|---|---|---|---|---|
| 6,129,321 | A | | 10/2000 | Minelli et al. | 248/183.1 |
| 6,173,933 | B1 | | 1/2001 | Whiteside et al. | 248/276.1 |
| 6,371,345 | B1 | * | 4/2002 | Leyden | B60R 11/02 224/553 |
| 6,439,530 | B1 | | 8/2002 | Schoenfish et al. | 248/346.06 |
| 7,418,738 | B2 | * | 9/2008 | Prendergast | A42B 3/04 2/22 |
| 7,690,614 | B1 | | 4/2010 | Mudd et al. | 248/346.06 |
| 8,739,313 | B2 | * | 6/2014 | Teetzel | A42B 3/04 2/422 |

(Continued)

OTHER PUBLICATIONS

Garmin Virb Series Owner's Manual, May 2014.

*Primary Examiner* — Anita M King
(74) *Attorney, Agent, or Firm* — Samuel M. Korte; Maxwell M. Ali

(57) ABSTRACT

A mounting system for removably mounting a portable electronic device to an object comprises a base, a mount, and a locking component. The base includes a central aperture and connects to an object on which the portable electronic device will be mounted. The mount includes a coupler and a device connector for connecting to the portable electronic device. The coupler includes a shaft that may be at least partially received within the central aperture of the base. The locking component is integrated with the base and is shiftable between a locked mode in which it retains the coupler in the base and an unlocked mode in which it allows the coupler to be released from the base. The locking component includes a ring with a detent, a catch that engages the detent, and a lever which can shift the locking component between the locked mode and the unlocked mode.

15 Claims, 12 Drawing Sheets

(56) References Cited

U.S. PATENT DOCUMENTS 9,121,544 B2 *  9/2015  DiCarlo ................ F16M 13/02

* cited by examiner

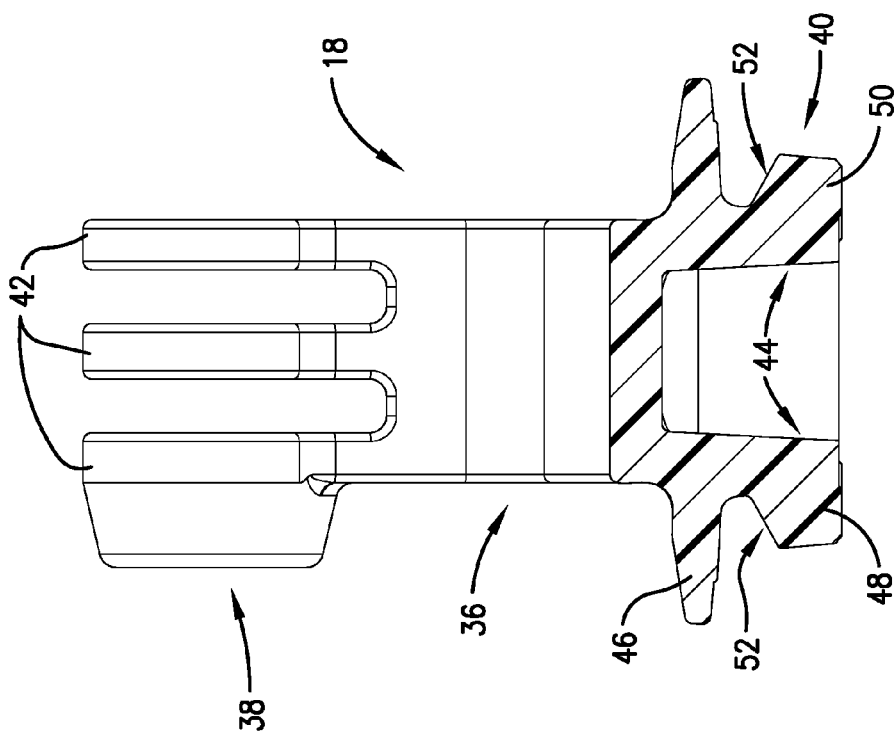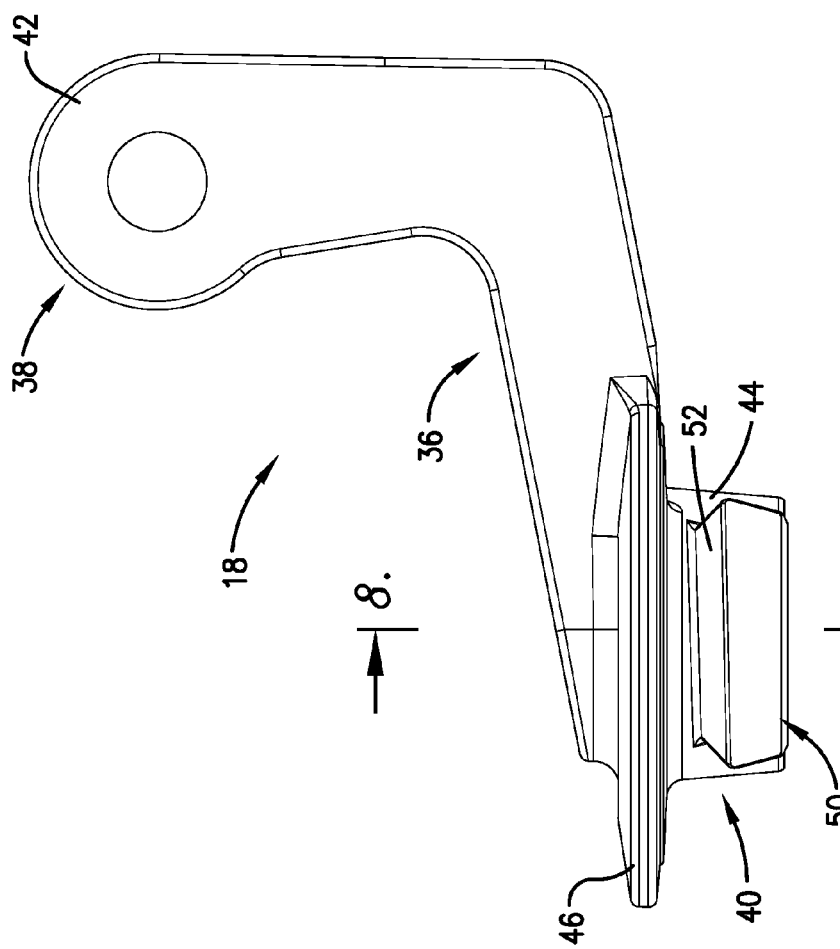

DEVICE MOUNTING SYSTEM WITH LOCKING LEVER

BACKGROUND

Users of portable electronic devices, such as action cameras and personal navigation devices, often desire to mount the devices on their bicycles, motorcycles, helmets, arms, vehicle dashboards, or other objects while engaging in various activities. Various types of mounts have been developed for this purpose.

SUMMARY

Embodiments of the present technology provide a mounting system for mounting a portable electronic device to an object. An embodiment of the system broadly comprises a base, a mount, and a locking component. The base connects to the object and includes a central aperture. The mount includes a coupler and a device connector for connecting to the portable electronic device. The coupler includes a shaft that may be at least partially received within the central aperture of the base and first and second tabs that protrude from the shaft. The locking component is integrated with the base and is shiftable between a locked mode in which it retains the coupler in the base and an unlocked mode in which it allows the coupler to be released from the base. The locking component includes a ring, a first catch, and a lever. The ring is positioned in the central aperture of the base and includes an outer band with a first detent. The first catch engages the first detent when the locking component is in the locked mode. The lever is coupled to the ring and receives a force that rotates the ring and shifts the locking component between the locked mode and the unlocked mode.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein:

FIG. 7 is a side view of the mount;

FIG. 8 is a sectional view of the mount cut along the line 8-8 in FIG. 7;

Figure 1:
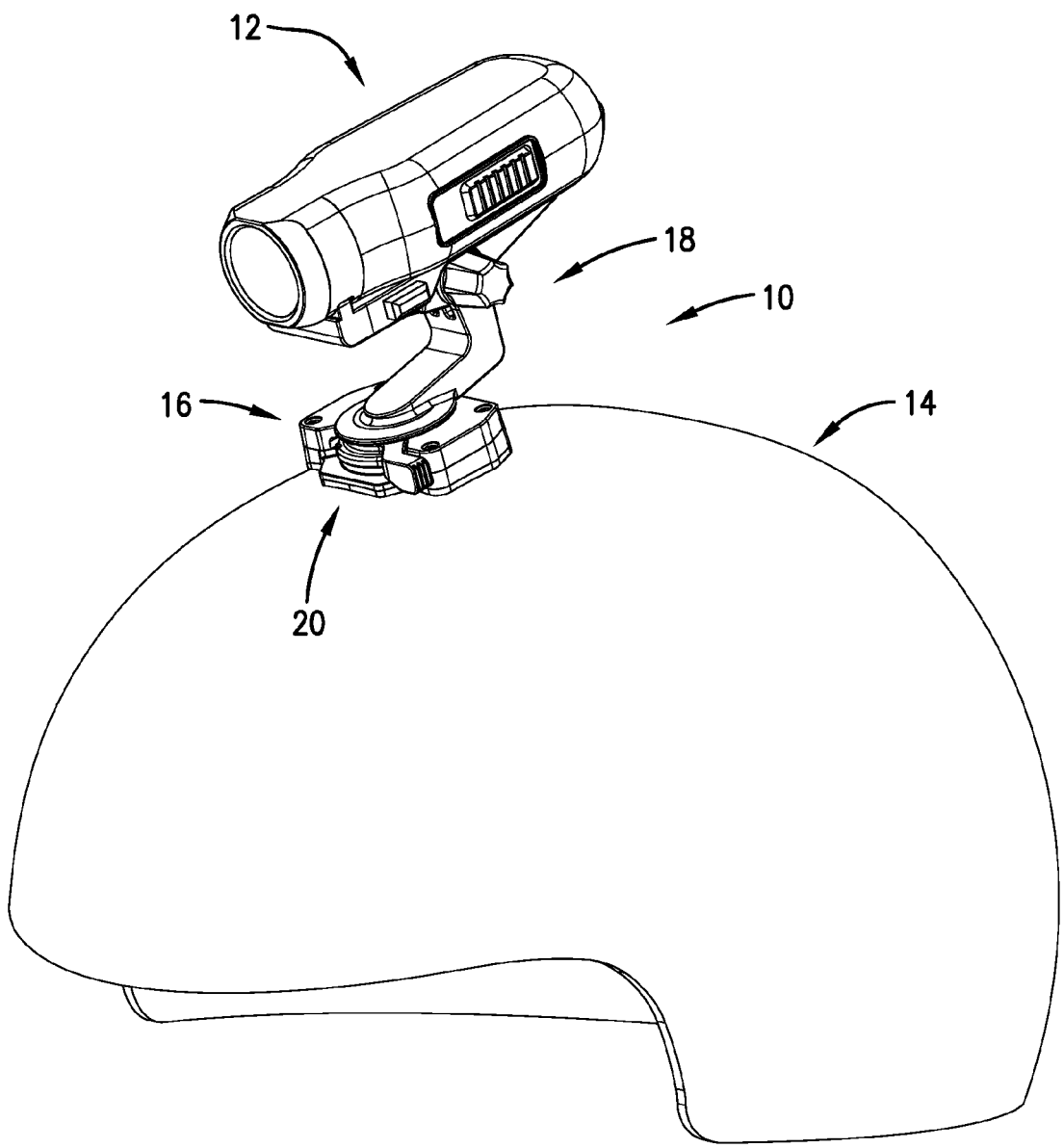
FIG. 1 is a perspective view of a mounting system, constructed in accordance with a first embodiment of the present technology, shown attaching an action camera to a helmet.

The drawing figures do not limit the present technology to the specific embodiments disclosed and described herein. The drawings are not necessarily to scale, emphasis instead being placed upon clearly illustrating the principles of the technology.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology relate to a mounting system for mounting a portable electronic device to an object. The portable electronic device may be used while a user engages in an activity and may include action cameras and personal navigation devices such as cell phones, smart phones, tablets, handheld global positioning system (GPS) devices, and the like. Activities may include walking, jogging, running, hiking, climbing, skiing, snow boarding, skate boarding, riding in a vehicle—particularly an off-road vehicle, and the like. The portable electronic device may be mounted to a handle bar of a bicycle or motorcycle, the user's shoulder, arm, leg, or torso, a helmet worn on the user's head, a vehicle dashboard, or other objects. Typically, the portable electronic device is mounted to the object only temporarily, as the user may want to remove the portable electronic device for interaction with other electronic devices, recharging the batteries of the portable electronic device, or similar activities. However, prior art mounting systems may include hardware, such as bolts which require tightening and loosening, that makes attachment and release of the portable electronic device tedious and time consuming. Embodiments of the present technology provide a mounting system with a partial-turn, lever-actuated locking component which allows quick and easy attachment and release of the portable electronic device.

Embodiments of the technology will now be described in more detail with reference to the drawing figures. Referring initially to FIGS. 1-19, a mounting system 10 is illustrated which removably mounts a portable electronic device 12 to an object 14. The mounting system 10 broadly comprises a base 16, a mount 18, and a locking component 20.

The base 16, as seen in FIGS. 1, 2, 4-6, and 14-19, generally couples to the object 14 and may include an upper wall 22, an opposing lower wall 24, and four sidewalls 26 positioned therebetween. An exemplary base 16 may have a generally rectangular box shape. The upper and lower walls 22, 24 of the base 16 may further include internal cutouts or apertures, which reduce the weight of the base 16 while still providing mechanical strength. In addition, the upper wall 22 may form a removable cover for the base 16. In other configurations, the upper wall 22 does not function as a removable cover. The upper wall 22 may include a top surface which forms a portion of the exterior of the base 16. The upper wall 22 may also include an aperture 28 with a shape of a portion of a circle and a first recess 30 with a shape of a portion of a circle of greater diameter than the aperture 28. The first recess 30 may be positioned toward the interior of the base 16 (below the top surface), with a circumference located radially outward from the aperture 28.

Figure 6:
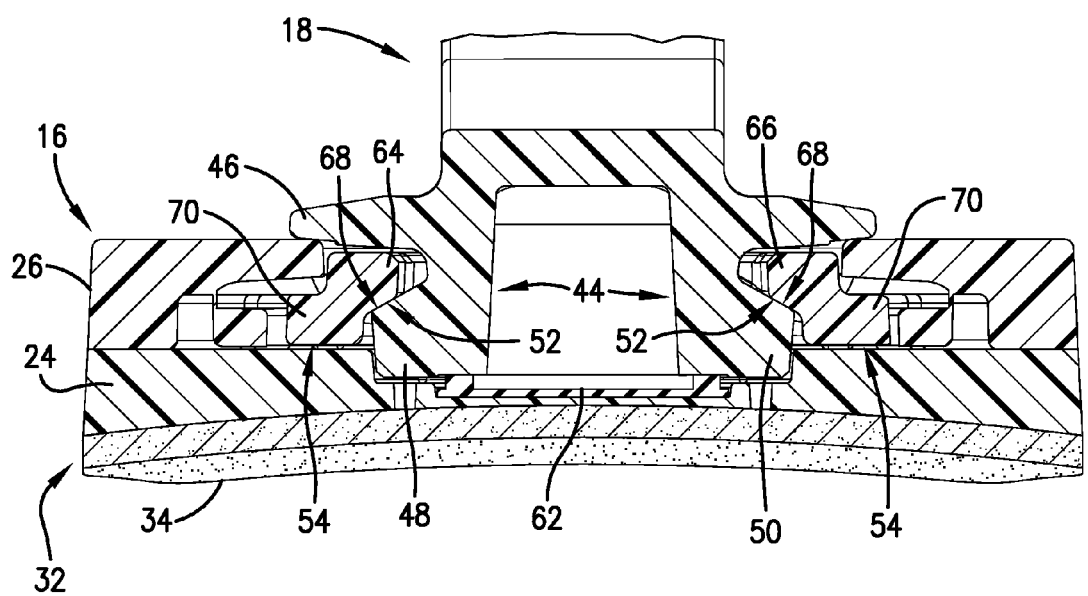
FIG. 6 is a sectional view of the mounting system cut along the line 6-6 in FIG. 5.
Figure 18:
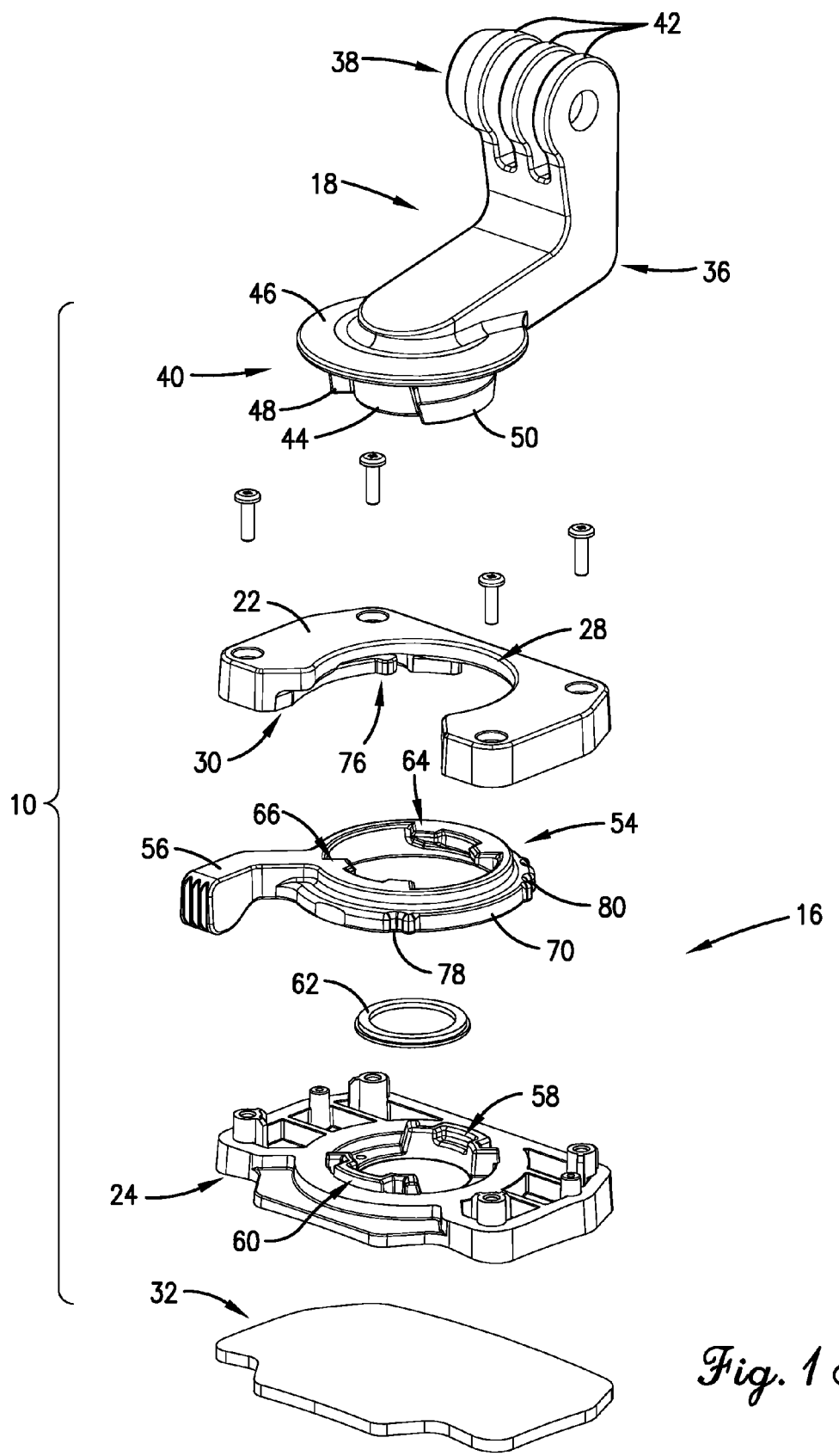
FIG. 18 is an exploded view of the mounting system from an upper forward perspective.
Figure 19:
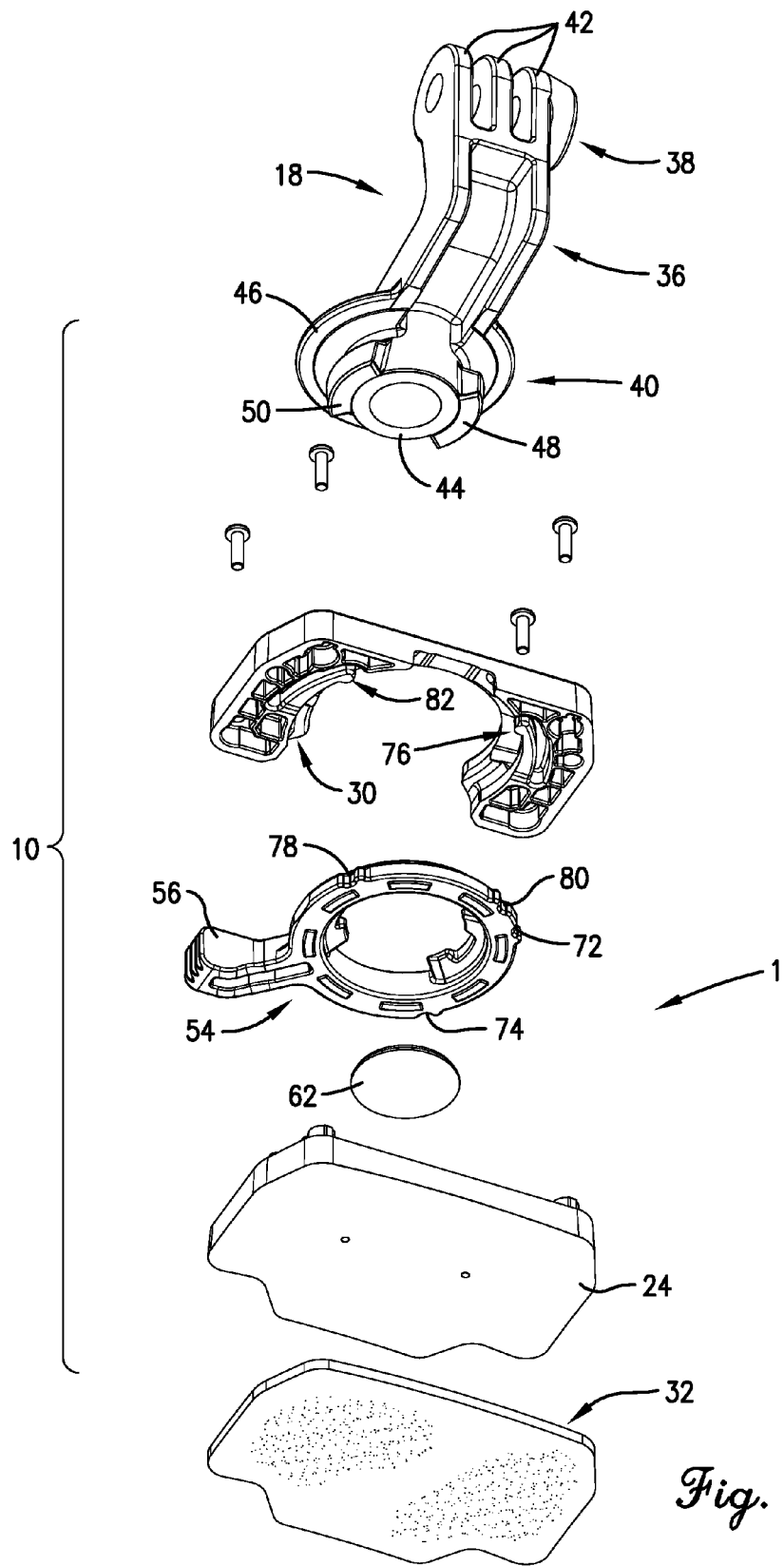
FIG. 19 is an exploded view of the mounting system from a lower rear perspective.

The base 16 may further include an object connector 32, best seen in FIGS. 6, 18, and 19, which generally connects to the object 14 or to an adapter or coupler which retains the object 14. An exemplary object connector 32 may include an object connector surface 34 located on the lower wall 24 of the base 16. The object connector surface 34 may have a concave curvature and may include adhesive or other bonding material that is operable to attach to the generally spherical outer surface of a helmet.

The mount 18, as seen in FIGS. 1-3, 5, 6, and 14-19, may include a body 36, a device connector 38, and a coupler 40. The body 36 may include various components to vary the orientation between the device connector 38 and the coupler 40. An exemplary body 36 may have a first arm portion coupled to the device connector 38 and a second arm portion coupled to the coupler 40 with an elbow connected therebetween giving the body 36 roughly an L-shape and providing an offset between the device connector 38 and the coupler 40.

The device connector 38 generally connects to the portable electronic device 12 or to an adapter or coupler which retains the portable electronic device 12, as best seen in FIG. 1. An exemplary device connector 38 may include a plurality of spaced-apart fingers 42, as best seen in FIGS. 2-3, 5, 7, 8, 18, and 19, with each finger 42 being roughly planar and disc-shaped with a rounded outer surface. In other configurations, other shapes may be employed. For instance, the fingers 42 may present geometries other than disc-shaped, such as rectangular, linear, trapezoidal, and the like. The planar surfaces of each finger 42 are parallel to the planar surfaces of the other fingers 42. Each finger 42 further includes a hole, such that the centers of the holes of all the finger are aligned with one another. The exemplary embodiment of the device connector 38 shown in the figures may include three fingers 42. Typically, the portable electronic device 12 includes a complementary connector with spaced-apart fingers that are positioned in the spaces between the fingers 42 when the portable electronic device 12 is coupled with the mount 18. A fastener such as a screw may be positioned in the holes. Furthermore, the portable electronic device 12 may be selectively rotated about the axis of the screw in order to adjust the orientation of the portable electronic device 12 with respect to the object 14.

The coupler 40 is generally received in the aperture 28 of the base 16. An exemplary coupler 40, as seen in FIGS. 3 and 6-8, may include a shaft 44, a disc 46, a first tab 48, and a second tab 50. The shaft 44 may be cylindrical in shape with a circumferential wall having an outer surface and an end surface. The disc 46 may be positioned at a first axial end of the shaft 44 and may have a greater diameter than the diameter of the shaft 44. The first tab 48 and the second tab 50 may be attached to, mounted on, or integrally formed with the outer surface of the shaft 44, such that the first and second tabs 48, 50 protrude outward from a second axial end of the shaft 44. The center of the first tab 48 may be positioned at one end of a diameter of the shaft 44, and the center of the second tab 50 may be positioned at the opposing end of the diameter. Each tab 48, 50 may have a width that occupies roughly 90 degrees along the circumference of the outer surface. Each tab 48, 50 may also include spaced-apart end surfaces and a cam surface 52 positioned therebetween which is oriented transverse to the outer surface of the shaft 44 and sloped or slanted at a first angle along the circumference of the shaft 44. Furthermore, there may be space along the circumference of the shaft 44 between the end surfaces of the first tab 48 and the end surfaces of the second tab 50.

The locking component 20, as seen in FIGS. 4, 6, and 14-19, may include a ring 54, a lever 56, a first alignment block 58, a second alignment block 60, and a vibration damping pad 62. In some configurations, the vibration damping pad 62 is omitted. The ring 54, as best seen in FIGS. 9-13, may be circular in shape with an outer circumferential surface and an interior defined by an inner circumferential surface. The ring 54 may include a first flange 64 and a second flange 66 attached to, mounted on, or integrally formed with the inner surface of the ring 54, so that the flanges 64, 66 protrude inward. Each flange 64, 66 may include spaced-apart end surfaces and a cam surface 68 positioned therebetween which is oriented transverse to the inner surface of the ring 54 and sloped or slanted along the inner circumference of the ring 54. The cam surfaces 68 of the flanges 64, 66 may be sloped at the same first angle as the cam surfaces 52 of the tabs 48, 50 of the shaft 44. In various embodiments, each flange 64, 66 may further include a cutout positioned roughly at the lateral center thereof. In some configurations, screws or other attachment mechanisms may be utilized. The ring 54 may further include an outer band 70 which is roughly half the height of the ring 54 and is attached to, mounted on, or integrally formed with the lower half of the outer surface of the ring 54. The outer band 70 protrudes outward from the ring 54 and creates a step from the outer edge of the outer band 70 to the outer edge of the ring 54.

Figure 9:
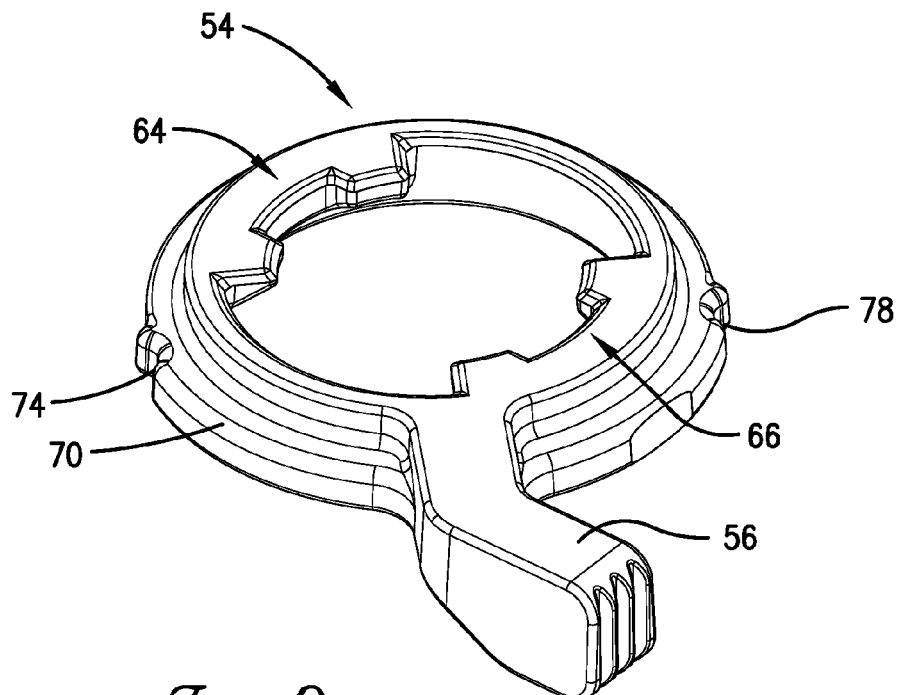
FIG. 9 is an upper perspective view of a ring and a lever of the locking component.
Figure 10:
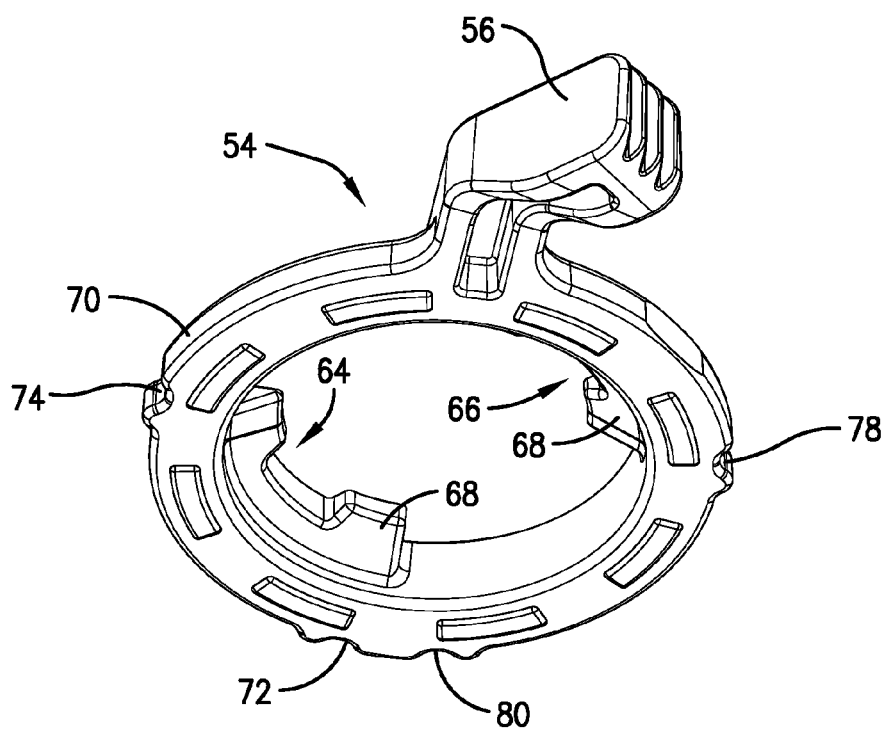
FIG. 10 is a lower perspective view of the ring and the lever.
Figure 11:
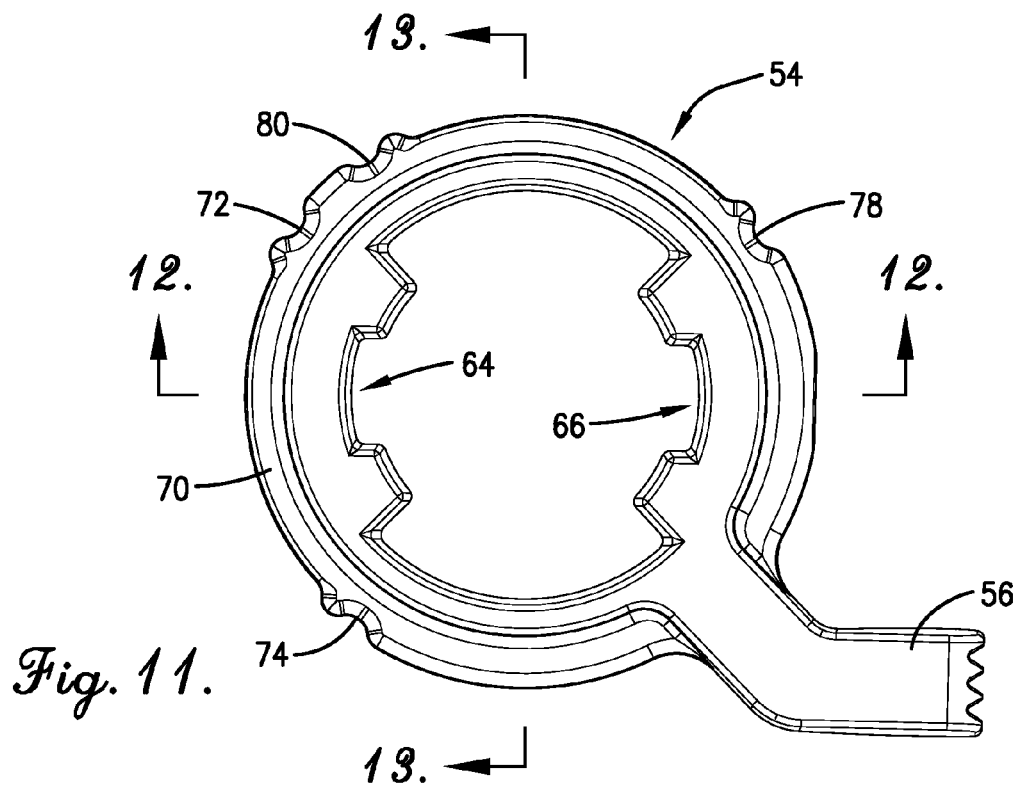
FIG. 11 is a top view of the ring and the lever.
Figure 12:
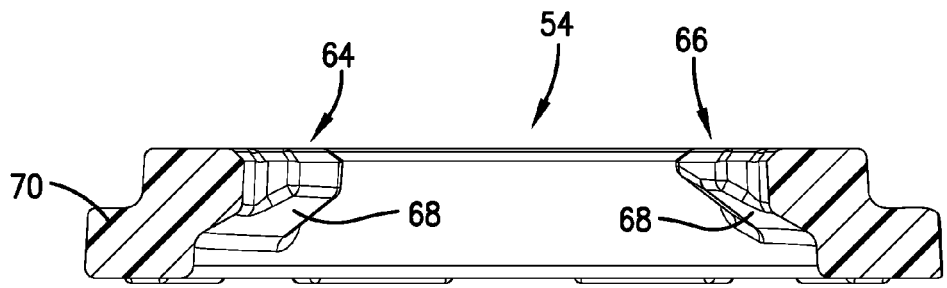
FIG. 12 is a sectional view of the ring cut along the line 12-12 in FIG. 11.
Figure 13:
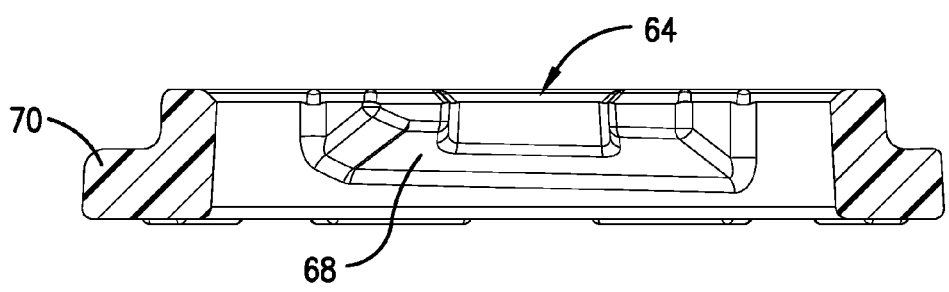
FIG. 13 is a sectional view of the ring cut along the line 13-13 in FIG. 11.

The lever 56, as best seen in FIGS. 9-11, may be attached to, mounted on, or integrally formed with the outer surface of the ring 54 and the outer surface of the outer band 70. The lever 56 may include a first arm portion coupled to the ring 54 and aligned with a center thereof, a second arm portion oriented at an offset angle relative to the first arm portion, and a connecting element (e.g., elbow) connecting the two arm portions. The lever 56 may be pushed or pulled in order to rotate the ring 54.

Figure 4:
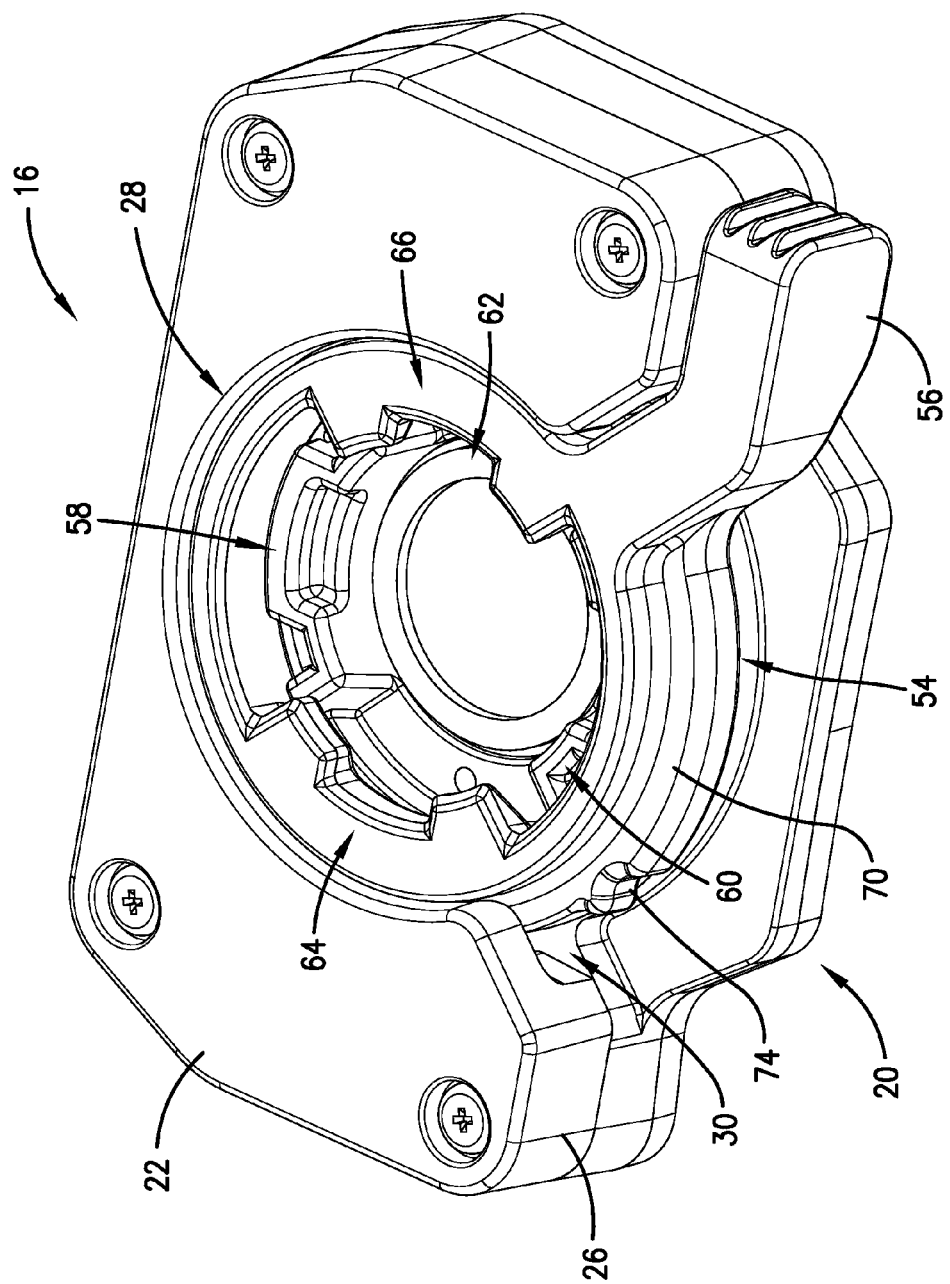
FIG. 4 is an upper perspective view of a base and a locking component of the mounting system.

Each alignment block 58, 60, as seen in FIGS. 4 and 18, may include an inner surface, an opposing outer surface, and two end surfaces positioned therebetween. The inner and outer surfaces may each have a curvature and the end surfaces may be planar such that the alignment block 58, 60 forms a portion of a hollow cylinder or annulus, such as a quarter of a hollow cylinder. The alignment blocks 58, 60 may be positioned on an upper surface of the lower wall 24 of the base 16 and spaced apart with the inner surfaces facing one another. The outer surfaces of the alignment blocks 58, 60 may face the inner surface of the ring 54. The alignment blocks 58, 60 may be oriented such that the inner surfaces face the outer surface of the shaft 44 when the coupler 40 is placed in the locking component 20. Furthermore, the end surfaces of the first and second alignment blocks 58, 60 may face the end surfaces of the first and second tabs 48, 50 when the coupler 40 is placed in the locking component 20.

The vibration damping pad 62, as seen in FIGS. 4, 6, 18, and 19, generally provides vibration reduction for the coupler 40 and in turn, the portable electronic device 12 attached to the device connector 38. The vibration damping pad 62 may be positioned on the upper surface of the lower wall 24 and may include a ring attached to an upper surface of a disc, both constructed from elastomeric material.

The base 16 and the locking component 20 may be assembled as follows. The sidewalls 26 may be attached to or integrally formed with the lower wall 24 of the base 16. The ring 54 may be placed on the upper surface of the lower wall 24 such that the ring 54 surrounds the first and second alignment blocks 58, 60. The upper wall 22 may be placed on the sidewalls 26 and the lower wall 24 such that the ring 54 is accessible through the aperture 28 and the first recess 30 covers the outer band 70. The upper wall 22 may then be attached to the sidewalls 26 and the lower wall 24 with one or more fasteners.

Figure 15:
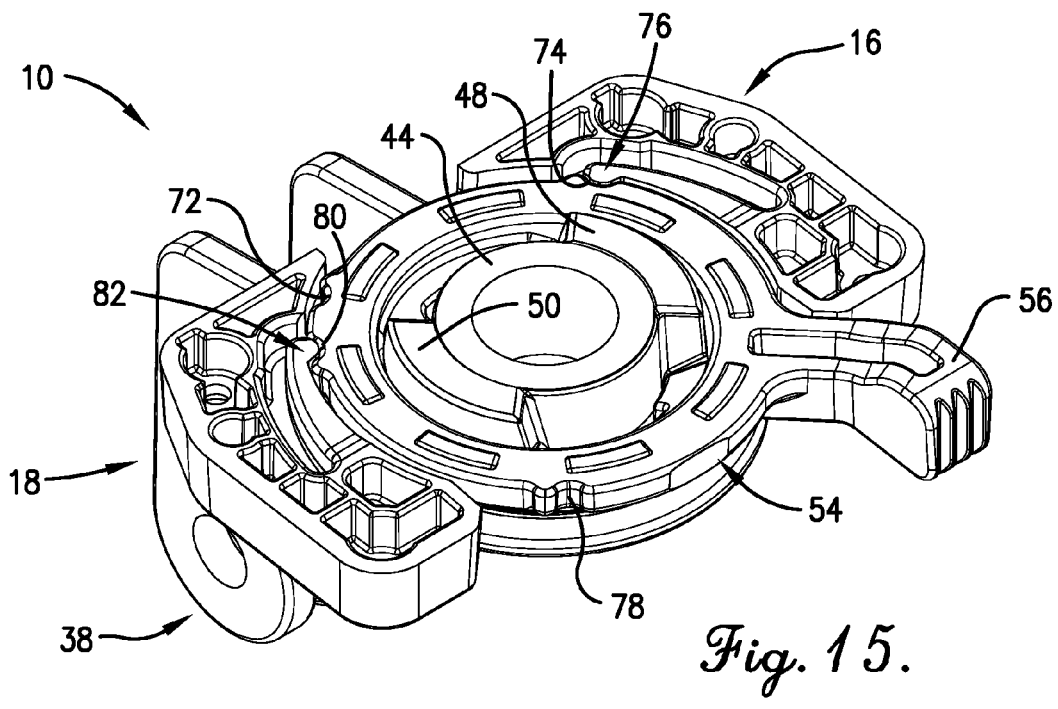
FIG. 15 is a lower perspective view of the mounting system with the lower wall of the base removed while the locking component is in the unlocked mode.
Figure 16:
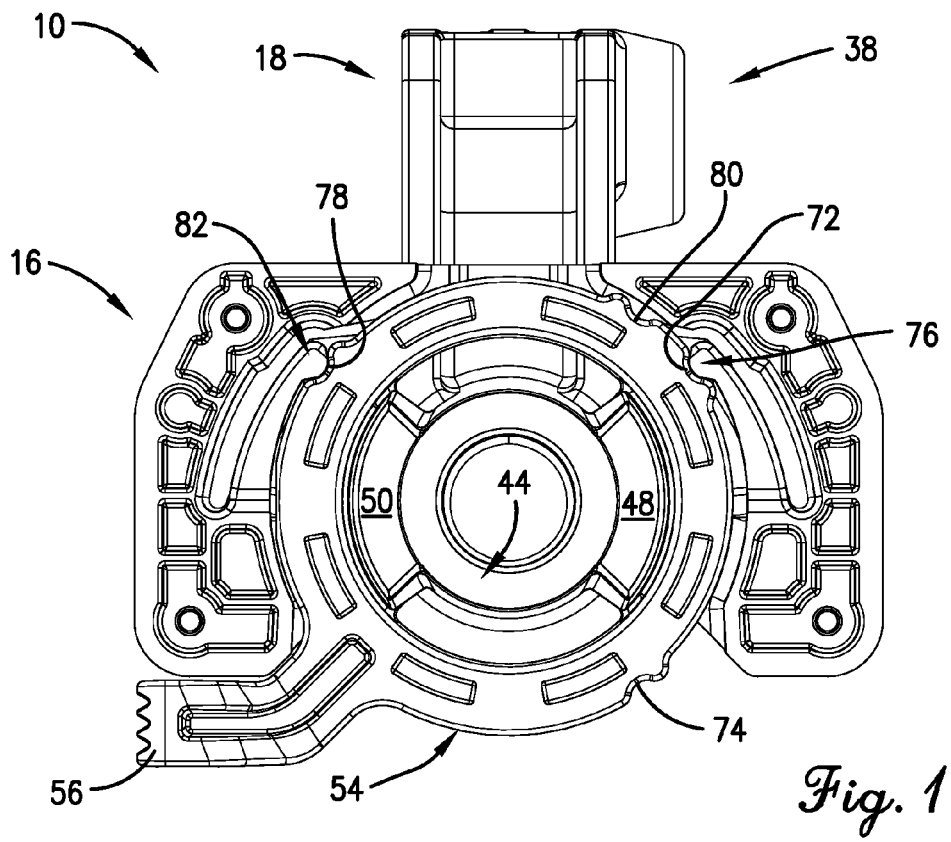
FIG. 16 is a bottom view of the mounting system with the lower wall of the base removed while the locking component is in a locked mode.
Figure 17:
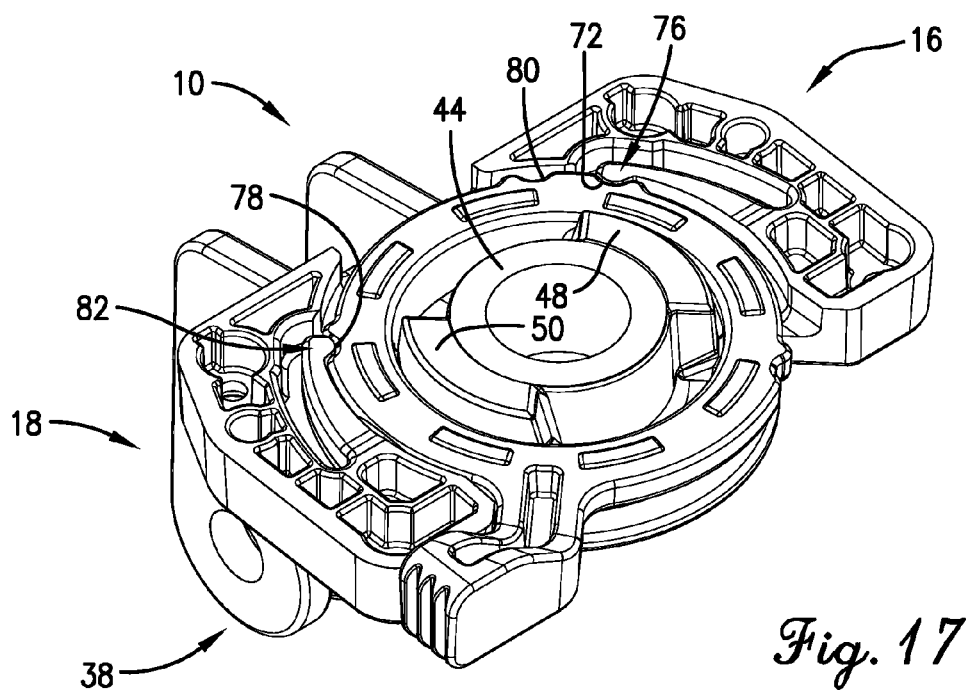
FIG. 17 is a lower perspective view of the mounting system with the lower wall of the base removed while the locking component is in the locked mode.

The locking component 20 generally operates in one of two modes—an unlocked or release mode and a locked or retain mode. The modes may be illustrated in FIGS. 14-17, wherein the mounting system 10 is seen from the bottom with the lower wall 24 and the object connector 32 removed, thereby exposing the primary elements of the locking component 20. In the unlocked mode seen in FIGS. 14 and 15, the coupler 40 may easily be placed in and removed from the locking component 20. In the locked mode seen in FIGS. 16 and 17, the coupler 40 is held tightly in the locking component 20 and may not be removed therefrom. The locking component 20 may be in the unlocked mode when the ring 54 is in a first rotational position, which includes a single rotational position. The locking component 20 may be in the locked mode when the ring 54 is in a second rotational position, which is adjacent to the first rotational position and includes any one of a range of rotational positions. In exemplary embodiments, the ring 54 may be rotated through a range of approximately 90 degrees. Thus, the first rotational position, indicating the unlocked mode and shown in FIGS. 14 and 15, may be located at a 0-degree angle, which may be any arbitrary rotational position of the ring 54. An exemplary 0-degree angle may have the ring 54 positioned such that the second arm portion of the lever 56 extends outward at a normal angle from the base 16. The second rotational position, indicating the locked mode, may be located from an angle greater than 0 degrees to an angle of approximately 90 degrees. An example of the second rotational position is shown in FIGS. 16 and 17, wherein the ring 54 is in the 90-degree position.

In order to reduce the chance that the locking component 20 inadvertently switches from the locked mode to the unlocked mode or vice-versa, the locking component 20 may further include at least one detent and at least one catch. An exemplary locking component 20 may include a first detent 72, a second detent 74, and a first catch 76. Each detent 72, 74, as seen in FIGS. 11 and 14-17, may have a generally concave shape and may be a notch or indentation positioned on an outer surface of the outer band 70 of the ring 54. The first catch 76, as seen in FIGS. 14-17, may have a rounded head coupled to one end of an arm which attaches to lower wall 24 of the base 16. The head may have a convex shape that is complementary to the concave shape of either detent 72, 74. The arm may have a spring action which urges the head against the detents 72, 74 and the outer surface of the outer band 70. The detents 72, 74 may be spaced approximately 90 degrees apart from one another on the outer surface of the outer band 70 with the first detent 72 positioned to be engaged by the first catch 76 when the locking component 20 is in the locked mode and the second detent 74 positioned to be engaged by the first catch 76 when the locking component 20 is in the unlocked mode. In various embodiments, the locking component 20 may include a third detent 78, a fourth detent 80, and a second catch 82, as best seen in FIGS. 14-17, to operate in parallel with the first and second detents 72, 74 and the first catch 76 and to provide redundant locking capability. Thus, the first detent 72 may be engaged by the first catch 76 while the third detent 78 is engaged by the second catch 82 when the locking component 20 is in the locked mode. The second detent 74 may be engaged by the first catch 76 while the fourth detent 80 is engaged by the second catch 82 when the locking component 20 is in the unlocked mode.

The mounting system 10 may operate as follows. The base 16 may be attached to the object 14. An exemplary object 14 may be a helmet worn on the user's head. The adhesive-coated object connector surface 34 may be attached to the outer surface of the helmet, typically so that the base 16 is positioned in the center of the crown of the helmet, as seen in FIG. 1. The base 16 may also be attached to either side or any other position on the helmet.

A portable electronic device 12, such as an action camera, may be connected to the device connector 38, as seen in FIG. 1. The portable electronic device 12 may include an adapter or connector with fingers that are complementary to the fingers 42 of the device connector 38 on the mount 18. With the fingers of the portable electronic device 12 placed in the fingers 42 of the device connector 38, a fastener, such as a screw, may be placed in the holes of the fingers 42. If desired, the portable electronic device 12 may be rotated about the axis of the screw and the device connector 38. A bolt may be placed on the screw and tightened.

Figure 2:
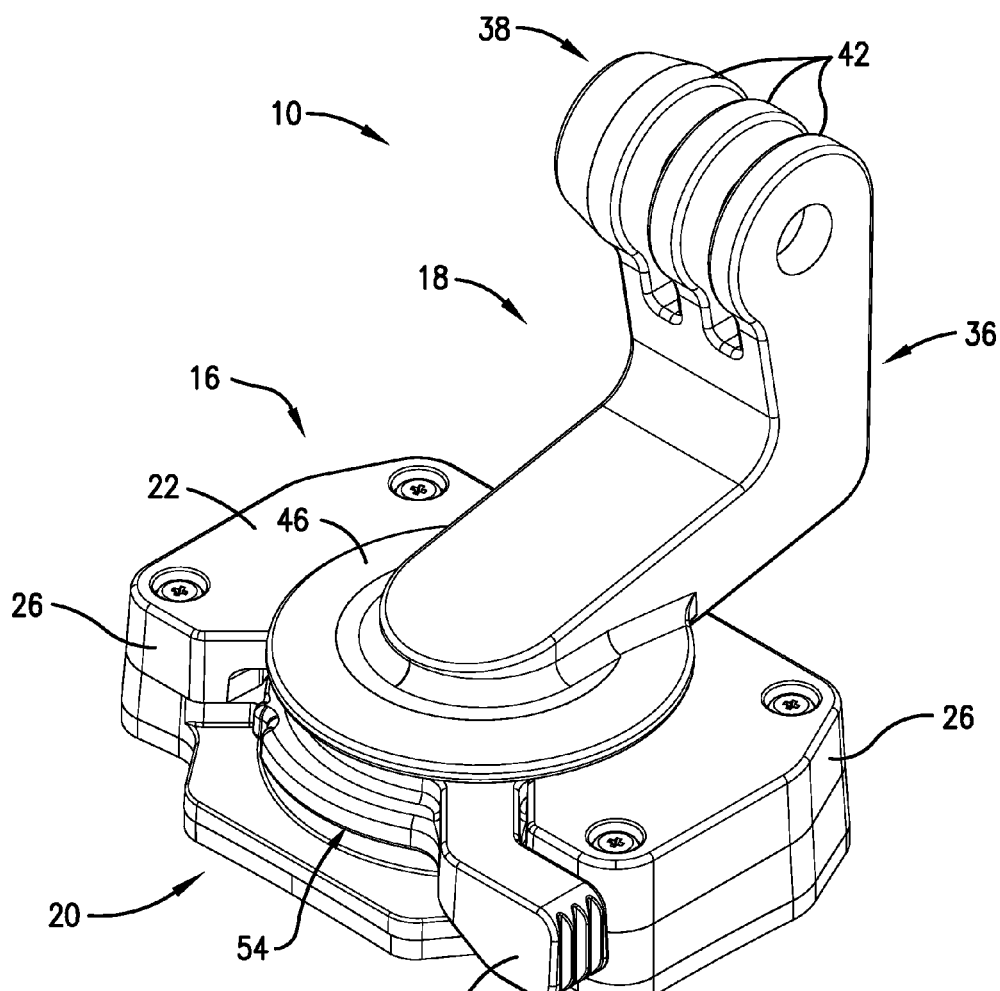
FIG. 2 is an upper perspective view of the mounting system.
Figure 3:
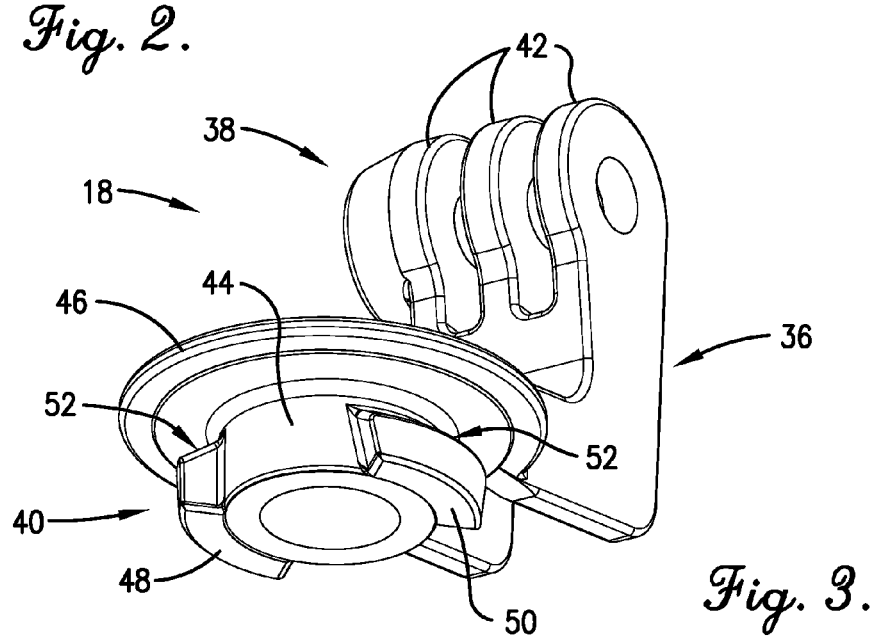
FIG. 3 is a lower perspective view of a mount and a coupler of the mounting system.
Figure 5:
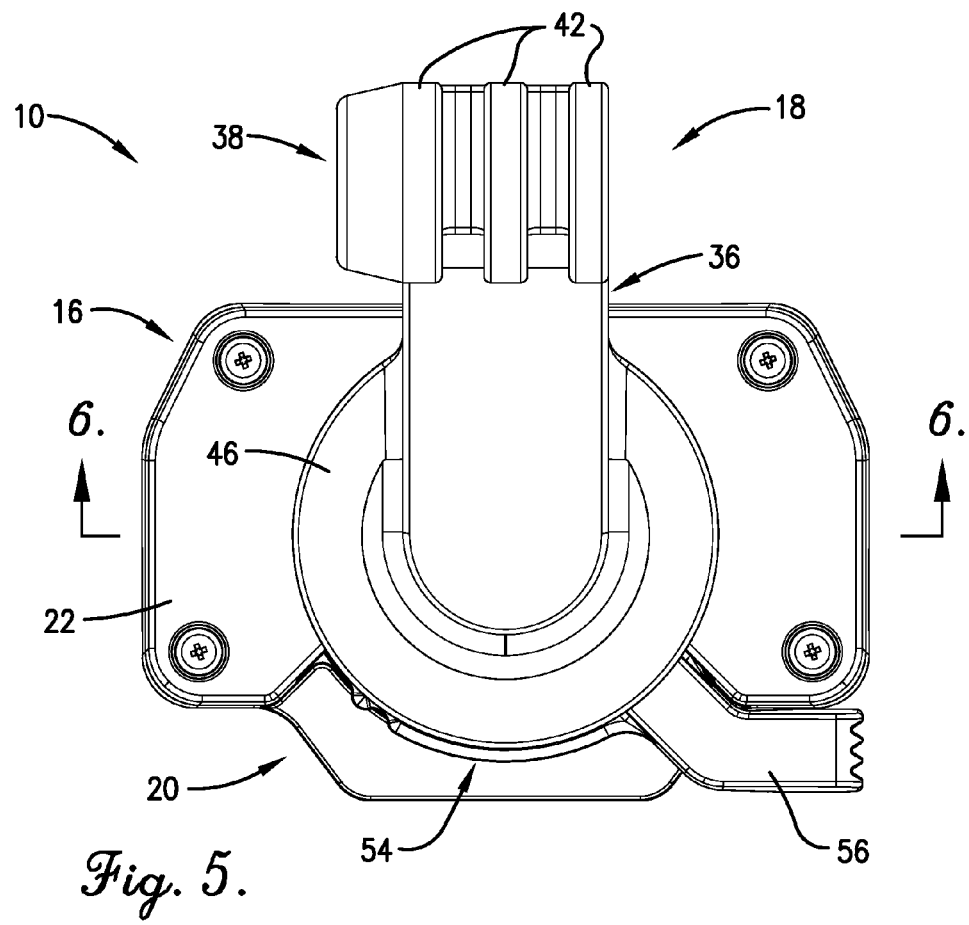
FIG. 5 is a top view of the mounting system.
Figure 14:
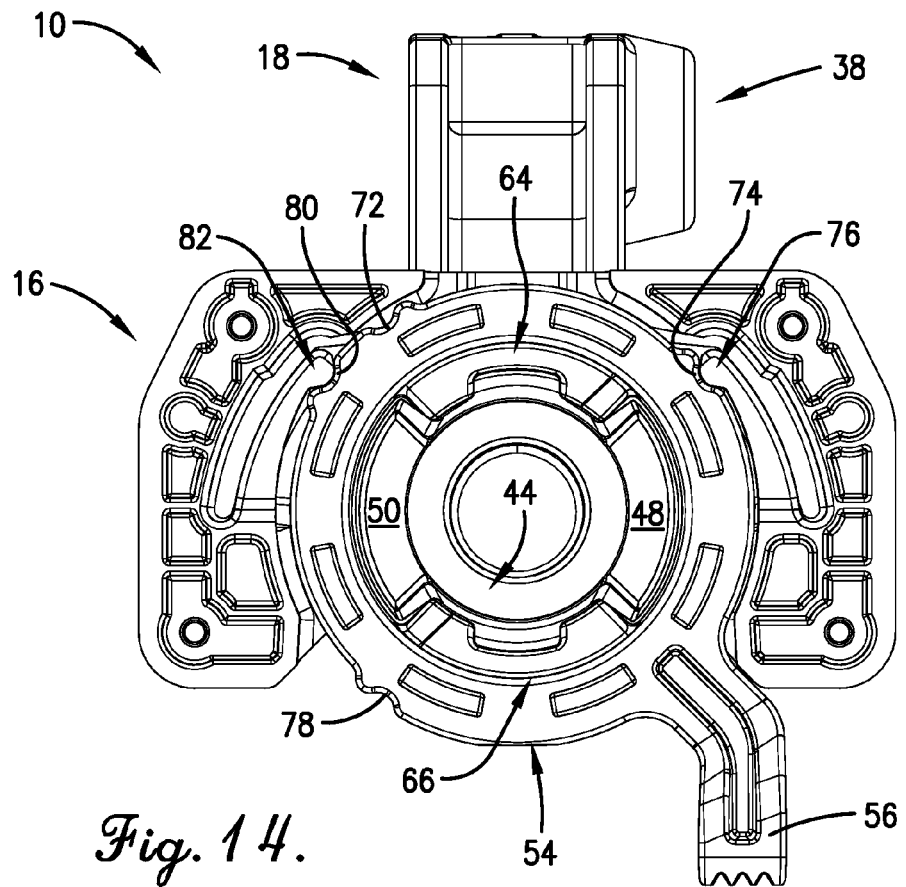
FIG. 14 is a bottom view of the mounting system with a lower wall of the base removed while the locking component is in an unlocked mode.

With the base 16 secured to the object 14 and the mount 18 attached to the portable electronic device 12, the mount 18 may be coupled to the base 16, as seen in FIGS. 1, 2, and 5. The locking component 20 may be in the unlocked mode with the ring 54 positioned in the 0-degree rotational position with the first catch 76 engaging the second detent 74, as seen in FIGS. 14 and 15. The coupler 40 may be placed in the locking component 20, such that the shaft 44 is positioned within the ring 54, and the first and second tabs 48, 50 are aligned with the alignment blocks 58, 60. Furthermore, the end surface of the shaft 44 may engage or contact the vibration damping pad 62. A force may be applied to the lever 56 to cause the ring 54 to rotate in order to lock the coupler 40 in the locking component 20. In the exemplary embodiment of the locking component 20, the ring 54 is rotated counterclockwise to switch the locking component 20 from the unlocked mode to the locked mode. A greater initial force may be required to disengage the first catch 76 from the second detent 74. Once the first catch 76 is disengaged, then the locking component 20 is in the locked mode and the ring 54 may be rotated counterclockwise with a lesser force until the first detent 72 encounters the first catch 76. A greater force may be once again applied to the ring 54 for the first catch 76 to engage the first detent 72. At this point, the ring 54 is at the end of its travel which is at the approximately 90-degree rotational position, as seen in FIGS. 16 and 17. In addition, the portable electronic device 12 is fully secured to the object 14.

While the locking component 20 is in the locked mode, the cam surfaces 52 of the first and second tabs 48, 50 engage and contact the cam surfaces 68 of the first and second flanges 64, 66. In addition, the cam surfaces 52, 68 may slide against one another while the ring 54 is being rotated in either direction. The cam surfaces 52, 68 are oriented such that counterclockwise rotation of the ring 54 generates a relatively downward axial force on the coupler 40. The relatively downward axial force tends to urge the end surface of the shaft 44 into the vibration damping pad 62, as best seen in FIG. 6, which may provide vibrational damping for the portable electronic device 12, as discussed in more detail below.

To remove the portable electronic device 12 from the object 14, a force may be applied to the ring 54 to cause the ring 54 to rotate in the clockwise direction. A greater initial force may be required to disengage the first catch 76 from the first detent 72. Once the first catch 76 is disengaged, then the ring 54 may be rotated clockwise with a lesser force until the second detent 74 encounters the first catch 76. All the while, the locking component 20 may still be in the locked mode and remains so until a greater force is applied to the ring 54 for the first catch 76 engages the second detent 74. At this point, the ring 54 may be at the beginning of its travel which is at the 0-degree rotational position. The locking component 20 may now be in the unlocked mode such that the coupler 40 may be disengaged from the ring 54 and the portable electronic device 12 may be removed from the object 14.

Figure 20:
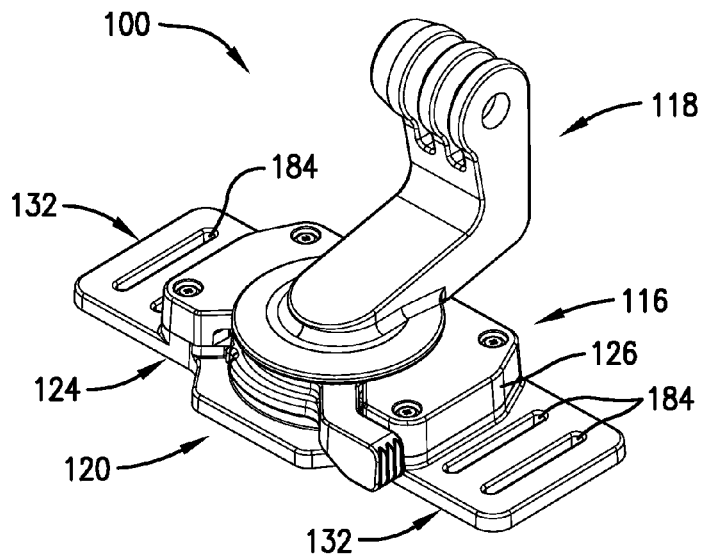
FIG. 20 is an upper perspective view of a first alternative embodiment of the mounting system.

A first alternative embodiment of the mounting system 100 that may be adapted more specifically to be used with a strap is shown in FIG. 20. The mounting system 100 may be similar in function to mounting system 10 and may include a base 116, a mount 118, and a locking component 120 that are all similar to the like named components of the mounting system 10. The base 116 may include a lower wall 124, sidewalls 126, and an object connector 132 coupled to the lower wall 124 and extending outward beyond the outer surfaces of opposing end sidewalls 126. The object connector 132 may also include a plurality of spaced-apart and elongated openings 184. An exemplary object connector 132 may include two openings 184 at one end and two openings 184 at the opposite end. The openings 184 may receive one or more straps which, in exemplary embodiments, attach the mounting system 100 to the user's wrist, arm, or chest in order to allow an action camera to be worn in those locations.

Figure 21:
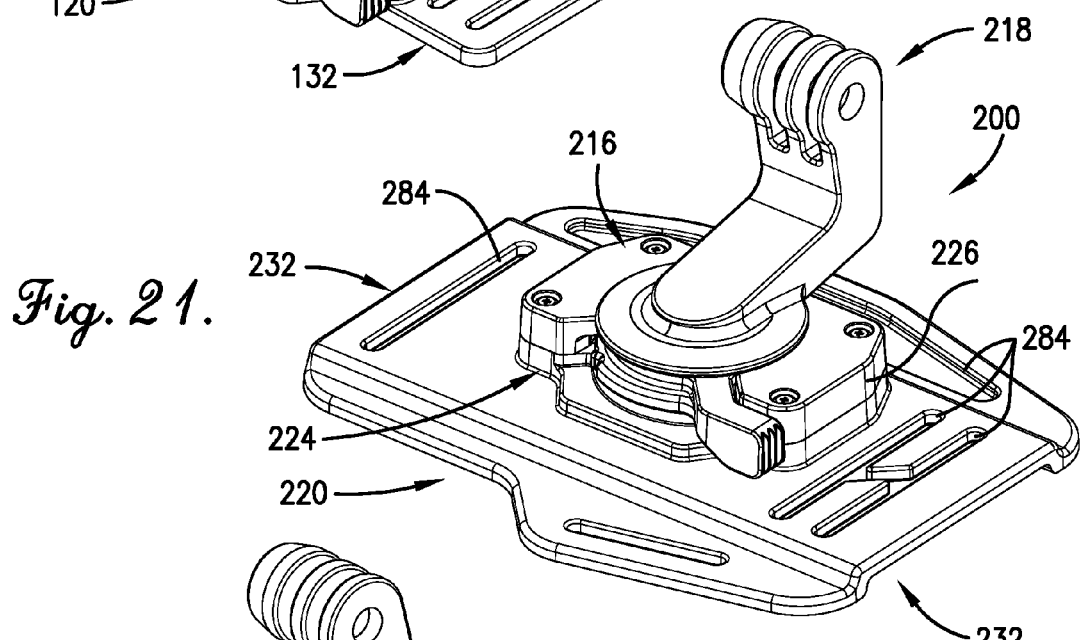
FIG. 21 is an upper perspective view of a second alternative embodiment of the mounting system.

A second alternative embodiment of the mounting system 200 that may be adapted for general purpose usage is shown in FIG. 21. The mounting system 200 may be similar in function to mounting system 10 and may include a base 216, a mount 218, and a locking component 220 that are all similar to the like named components of the mounting system 10. The base 216 may include a lower wall 224, sidewalls 226, and an object connector 232 coupled to the lower wall 224 and extending outward beyond the outer surfaces of sidewalls 226. The edges of the object connector 232 may include features that extend outward at non-orthogonal angles. The object connector 232 may also include one or more contours which allow the object connector 232 to adapt to non-planar surfaces or objects. In addition, the object connector 232 may also include a plurality of openings 284. The shape and size of the openings 284 may vary, with some being narrow and straight and others being irregular shaped with larger apertures. The openings 284 may receive straps or other fasteners that can attach the mounting system 200 to vests, backpacks, or other items worn by the user.

Figure 22:
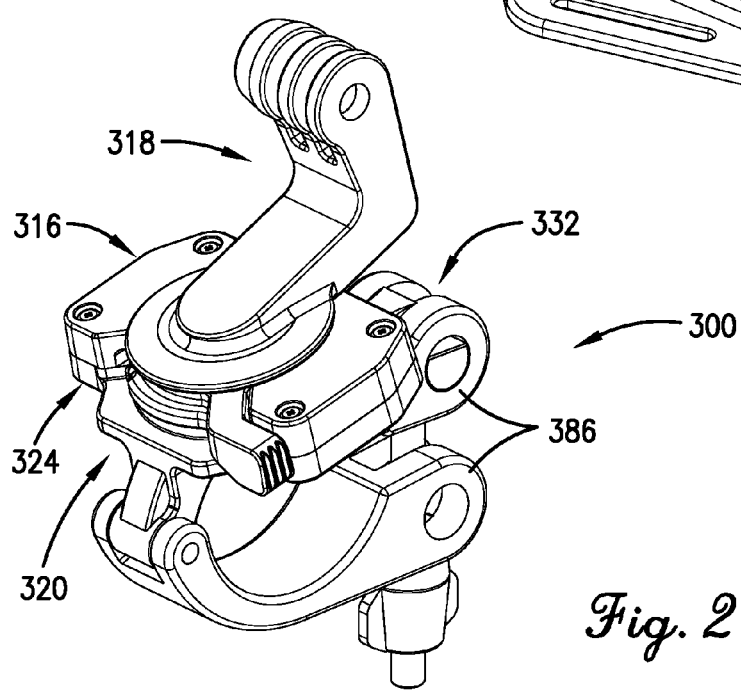
FIG. 22 is an upper perspective view of a third alternative embodiment of the mounting system.

A third alternative embodiment of the mounting system 300 that may be adapted for usage with handlebars is shown in FIG. 22. The mounting system 300 may be similar in function to mounting system 10 and may include a base 316, a mount 318, and a locking component 320 that are all similar to the like named components of the mounting system 10. The base 316 may include a lower wall 324 and an object connector 232 that attaches thereto. The object connector 332 may include a C-clamp 386. Thus, the mounting system 300 may be directly attached to the handlebars of a bicycle or motorcycle in order to allow an action camera to be used while cycling.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

What is claimed is:

1. A mounting system for removably mounting a portable electronic device to an object, the mounting system comprising:
    a base for connecting to an object on which the portable electronic device will be mounted, the base having a central aperture, wherein the base includes a lower wall with an object connector surface positioned thereon, the object connector surface having an adhesive coating;
    a mount including—
        a device connector for connecting to the portable electronic device, and
        a coupler including
            a shaft that may be at least partially received within the central aperture of the base, and first and second tabs protruding from the shaft; and
a locking component integrated with the base and shiftable between a locked mode in which it retains the coupler in the base and an unlocked mode in which it allows the coupler to be released from the base, the locking component including—
a ring positioned in the central aperture of the base, the ring including an outer band with a first detent,
a first catch configured to engage the first detent when the locking component is in the locked mode, and
a lever coupled to the ring, the lever configured to receive a force that rotates the ring and shifts the locking component between the locked mode and the unlocked mode.

2. The mounting system of claim 1, wherein the outer band includes a second detent configured to engage the first catch when the locking component is in the unlocked mode.

3. The mounting system of claim 1, wherein the device connector includes a plurality of spaced-apart fingers oriented parallel to one another.

4. The mounting system of claim 3, wherein each finger includes a hole aligned with the holes of the other fingers, the holes configured to receive a screw.

5. The mounting system of claim 1, wherein
the first tab and the second tab each include spaced-apart end surfaces and a cam surface positioned therebetween, the cam surface oriented transverse to an outer surface of the shaft and sloped along the circumference of the shaft,
the ring includes an inner surface with a first flange protruding inward therefrom and a second flange protruding inward therefrom, diametrically opposed to the first flange, wherein the first flange and the second flange each include spaced-apart end surfaces and a cam surface positioned therebetween, each cam surface oriented transverse to the inner surface of the ring and sloped along the circumference thereof, and
the cam surface of the first flange engages the cam surface of the first tab and the cam surface of the second flange engages the cam surface of the second tab when the locking component is in the locked mode.

6. The mounting system of claim 5, wherein the mount further includes a first alignment block and a second alignment block positioned opposing one another on an upper surface of the lower wall within the interior of the ring, wherein inner surfaces of the first and second alignment blocks face the outer surface of the shaft and the end surfaces of the first and second alignment blocks face the end surfaces of the first and second tabs when the coupler is placed within the locking component.

7. The mounting system of claim 1, wherein the ring is in a first rotational position when the locking component is in the unlocked mode and the ring is in one of a plurality of rotational positions when the locking component is in the locked mode.

8. A mounting system for removably mounting a portable electronic device to an object, the mounting system comprising:
a base for connecting to an object on which the portable electronic device will be mounted, the base having a central aperture, wherein the base includes a lower wall with an object connector surface positioned thereon, the object connector surface having a concave curvature and an adhesive coating;
a mount including—
a device connector for connecting to the portable electronic device, and
a coupler including
a shaft that may be at least partially received within the central aperture of the base, and
first and second tabs protruding from the shaft, the first and second tabs each including a first angle surface; and
a locking component integrated with the base and shiftable between a locked mode in which it retains the coupler in the base and an unlocked mode in which it allows the coupler to be released from the base, the locking component including—
a ring positioned in the central aperture of the base, the ring including
an outer band with a first detent, and
first and second flanges protruding inward from an inner surface of the ring, the first and second flanges each including a first angle surface, wherein the first angle surfaces of the first and second flanges engage the first angle surfaces of the first and second tabs when the locking component is in the locked mode,
a first catch configured to engage the first detent when the locking component is in the locked mode, and
a lever coupled to the ring, the lever configured to receive a force that rotates the ring and shifts the locking component between the locked mode and the unlocked mode.

9. The mounting system of claim 8, wherein each first angle surface of the first and second tabs is a cam surface which is positioned between opposing end surfaces and sloped along the circumference of an outer surface of the shaft of the coupler.

10. The mounting system of claim 8, wherein each first angle surface of the first and second flanges is a cam surface which is positioned between opposing end surfaces and sloped along the circumference of the inner surface of the ring.

11. The mounting system of claim 8, wherein the outer band includes a second detent configured to engage the first catch when the locking component is in the unlocked mode.

12. The mounting system of claim 8, wherein the device connector includes a plurality of spaced-apart, planar, disc-shaped fingers oriented parallel to one another.

13. The mounting system of claim 12, wherein each finger includes a hole aligned with the holes of the other fingers, the holes configured to receive a screw.

14. The mounting system of claim 8, wherein the mount further includes a first alignment block and a second alignment block positioned opposing one another on an upper surface of the lower wall within the interior of the ring, wherein inner surfaces of the first and second alignment blocks face the outer surface of the shaft and the first and second alignment blocks are positioned in the spaces between the first and second tabs when the coupler is placed within the locking component.

15. The mounting system of claim 8, wherein the ring is in a first rotational position when the locking component is in the unlocked mode and the ring is in one of a plurality of rotational positions when the locking component is in the locked mode.

* * * * *